United States Patent
Wu et al.

(10) Patent No.: US 8,017,523 B1
(45) Date of Patent: Sep. 13, 2011

(54) DEPOSITION OF DOPED COPPER SEED LAYERS HAVING IMPROVED RELIABILITY

(75) Inventors: Hui-Jung Wu, Fremont, CA (US); Daniel R. Juliano, Santa Clara, CA (US); Wen Wu, San Jose, CA (US); Girish Dixit, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/122,118

(22) Filed: May 16, 2008

(51) Int. Cl.
*H01L 21/4763* (2006.01)

(52) U.S. Cl. ......... 438/687; 438/627; 438/675; 438/678

(58) Field of Classification Search ............. 438/687, 438/627, 118, 622, 656, 675, 640, 643, 681, 438/725, 618, 624, 636, 639, 672, 633, 637; 257/758, 751, 752, 762, 771, 753, 765
See application file for complete search history.

(56) References Cited

U.S. PATENT DOCUMENTS

| | | | |
|---|---|---|---|
| 3,763,031 A | 10/1973 | Scow et al. | |
| 3,767,551 A | 10/1973 | Lang et al. | |
| 4,058,430 A | 11/1977 | Suntola et al. | |
| 4,392,111 A | 7/1983 | Rostoker | |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A | 10/1989 | Pan | |
| 4,963,524 A | 10/1990 | Yamazaki | |
| 4,999,096 A | 3/1991 | Nihei et al. | |
| 5,009,963 A | 4/1991 | Ohmi et al. | |
| 5,084,412 A | 1/1992 | Nakasaki | |
| 5,126,028 A | 6/1992 | Hurwitt et al. | |

(Continued)

FOREIGN PATENT DOCUMENTS

CN 1567548 1/2005

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner* — Victor Mandala
*Assistant Examiner* — Whitney Moore
(74) *Attorney, Agent, or Firm* — Weaver Austin Villeneuve & Sampson LLP

(57) ABSTRACT

Improved methods of depositing copper seed layers in copper interconnect structure fabrication processes are provided. Also provided are the resulting structures, which have improved electromigration performance and reduced line resistance. According to various embodiments, the methods involve depositing a copper seed bilayer on a barrier layer in a recessed feature on a partially fabricated semiconductor substrate. The bilayer has a copper alloy seed layer and a pure copper seed layer, with the pure copper seed layer is deposited on the copper alloy seed layer. The copper seed bilayers have reduced line resistance increase and better electromigration performance than conventional doped copper seed layers. Precise line resistance control is achieved by tuning the bilayer thickness to meet the desired electromigration performance.

16 Claims, 11 Drawing Sheets

U.S. PATENT DOCUMENTS

| | | |
|---|---|---|
| 5,139,825 A | 8/1992 | Gordon et al. |
| 5,178,739 A | 1/1993 | Barnes et al. |
| 5,194,398 A | 3/1993 | Miyachi et al. |
| 5,221,449 A | 6/1993 | Colgan et al. |
| 5,281,485 A | 1/1994 | Colgan et al. |
| 5,298,091 A | 3/1994 | Edwards, III et al. |
| 5,378,506 A | 1/1995 | Imai et al. |
| 5,482,611 A | 1/1996 | Helmer et al. |
| 5,622,608 A | 4/1997 | Lanford et al. |
| 5,629,221 A | 5/1997 | Chao et al. |
| 5,654,233 A | 8/1997 | Yu |
| 5,656,860 A | 8/1997 | Lee |
| 5,766,379 A | 6/1998 | Lanford et al. |
| 5,789,027 A | 8/1998 | Watkins et al. |
| 5,801,089 A | 9/1998 | Kenney |
| 5,904,565 A | 5/1999 | Nguyen et al. |
| 5,948,215 A | 9/1999 | Lantsman |
| 5,962,923 A | 10/1999 | Xu et al. |
| 5,969,422 A | 10/1999 | Ting et al. |
| 5,985,762 A | 11/1999 | Geffken et al. |
| 6,037,257 A | 3/2000 | Chiang et al. |
| 6,046,108 A | 4/2000 | Liu et al. |
| 6,074,544 A | 6/2000 | Reid et al. |
| 6,077,403 A | 6/2000 | Kobayashi et al. |
| 6,077,780 A | 6/2000 | Dubin |
| 6,080,285 A | 6/2000 | Liu et al. |
| 6,093,966 A | 7/2000 | Venkatraman et al. |
| 6,099,702 A | 8/2000 | Reid et al. |
| 6,100,200 A | 8/2000 | Van Buskirk et al. |
| 6,105,078 A | 8/2000 | Crockett et al. |
| 6,110,346 A | 8/2000 | Reid et al. |
| 6,114,238 A | 9/2000 | Liao |
| 6,120,641 A | 9/2000 | Stevens et al. |
| 6,124,203 A | 9/2000 | Joo et al. |
| 6,126,798 A | 10/2000 | Reid et al. |
| 6,139,712 A | 10/2000 | Patton et al. |
| 6,147,000 A | 11/2000 | You et al. |
| 6,156,167 A | 12/2000 | Patton et al. |
| 6,159,354 A | 12/2000 | Contolini et al. |
| 6,159,857 A | 12/2000 | Liu et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,200,893 B1 | 3/2001 | Sneh |
| 6,203,613 B1 | 3/2001 | Gates et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,235,163 B1 | 5/2001 | Angelo et al. |
| 6,249,055 B1 | 6/2001 | Dubin |
| 6,251,242 B1 | 6/2001 | Fu et al. |
| 6,265,313 B1 | 7/2001 | Huang et al. |
| 6,271,591 B1 | 8/2001 | Dubin et al. |
| 6,274,008 B1 | 8/2001 | Gopalraja et al. |
| 6,277,249 B1 | 8/2001 | Gopalraja et al. |
| 6,280,597 B1 | 8/2001 | Kashiwada et al. |
| 6,287,977 B1 | 9/2001 | Hashim et al. |
| 6,333,547 B1 | 12/2001 | Tanaka et al. |
| 6,340,435 B1 | 1/2002 | Bjorkman et al. |
| 6,342,133 B2 | 1/2002 | D'Couto et al. |
| 6,342,448 B1 | 1/2002 | Lin et al. |
| 6,350,353 B2 | 2/2002 | Gopalraja et al. |
| 6,358,376 B1 | 3/2002 | Wang et al. |
| 6,387,805 B2 | 5/2002 | Ding et al. |
| 6,391,785 B1 | 5/2002 | Satta et al. |
| 6,395,642 B1 | 5/2002 | Liu et al. |
| 6,402,907 B1 | 6/2002 | Rich |
| 6,417,094 B1 | 7/2002 | Zhao et al. |
| 6,436,251 B2 | 8/2002 | Gopalraja et al. |
| 6,440,854 B1 | 8/2002 | Rozbicki |
| 6,444,104 B2 | 9/2002 | Gopalraja et al. |
| 6,448,176 B1 | 9/2002 | Grill et al. |
| 6,451,177 B1 | 9/2002 | Gopalraja et al. |
| 6,492,262 B2 | 12/2002 | Uzoh |
| 6,498,091 B1 | 12/2002 | Chen et al. |
| 6,500,762 B2 | 12/2002 | Hashim et al. |
| 6,509,267 B1 | 1/2003 | Woo et al. |
| 6,538,324 B1 | 3/2003 | Tagami et al. |
| 6,541,374 B1 | 4/2003 | de Felipe et al. |
| 6,554,914 B1 | 4/2003 | Rozbicki et al. |
| 6,559,061 B2 | 5/2003 | Hashim et al. |
| 6,562,715 B1 | 5/2003 | Chen et al. |
| 6,566,246 B1 | 5/2003 | de Felipe et al. |
| 6,589,887 B1 | 7/2003 | Dalton et al. |
| 6,605,534 B1 | 8/2003 | Chung et al. |
| 6,607,977 B1 | 8/2003 | Rozbicki et al. |
| 6,607,982 B1 | 8/2003 | Powell et al. |
| 6,613,199 B1 | 9/2003 | Tobin et al. |
| 6,624,066 B2 | 9/2003 | Lu et al. |
| 6,642,146 B1 | 11/2003 | Rozbicki et al. |
| 6,652,718 B1 | 11/2003 | D'Couto et al. |
| 6,656,841 B1 | 12/2003 | Kim |
| 6,660,622 B2 | 12/2003 | Chen et al. |
| 6,673,716 B1 | 1/2004 | D'Couto et al. |
| 6,683,425 B1 | 1/2004 | Lai |
| 6,706,142 B2 | 3/2004 | Savas et al. |
| 6,706,155 B2 | 3/2004 | Morimoto et al. |
| 6,709,557 B1 | 3/2004 | Kailasam et al. |
| 6,709,987 B2 | 3/2004 | Hashim et al. |
| 6,755,945 B2 | 6/2004 | Yasar et al. |
| 6,758,947 B2 | 7/2004 | Chiang et al. |
| 6,764,940 B1 | 7/2004 | Rozbicki et al. |
| 6,784,096 B2 | 8/2004 | Chen et al. |
| 6,790,776 B2 | 9/2004 | Ding et al. |
| 6,841,044 B1 | 1/2005 | Ruzic |
| 6,893,541 B2 | 5/2005 | Chiang et al. |
| 6,905,965 B2 | 6/2005 | Subrahmanyan et al. |
| 6,919,275 B2 | 7/2005 | Chiang et al. |
| 6,943,111 B2 | 9/2005 | Lin et al. |
| 6,949,457 B1 | 9/2005 | Fiordalice et al. |
| 6,969,448 B1 | 11/2005 | Lau |
| 6,992,012 B2 | 1/2006 | Haskim et al. |
| 7,030,031 B2 | 4/2006 | Wille et al. |
| 7,037,830 B1 | 5/2006 | Rumer et al. |
| 7,048,837 B2 | 5/2006 | Somekh et al. |
| 7,074,714 B2 | 7/2006 | Chiang et al. |
| 7,135,402 B2 | 11/2006 | Lin et al. |
| 7,186,648 B1 | 3/2007 | Rozbicki et al. |
| 7,253,109 B2 | 8/2007 | Ding et al. |
| 7,294,574 B2 | 11/2007 | Ding et al. |
| 7,365,001 B2 | 4/2008 | Yang et al. |
| 7,510,634 B1 | 3/2009 | Klawuhn et al. |
| 7,645,696 B1 | 1/2010 | Dulkin et al. |
| 7,659,197 B1 | 2/2010 | Juliano |
| 7,682,966 B1 | 3/2010 | Rozbicki et al. |
| 7,732,314 B1 | 6/2010 | Danek et al. |
| 2001/0039113 A1 | 11/2001 | Blalock et al. |
| 2002/0000382 A1 | 1/2002 | Morrissey et al. |
| 2002/0028576 A1 | 3/2002 | Hashim et al. |
| 2002/0041028 A1 | 4/2002 | Choi et al. |
| 2002/0110999 A1 | 8/2002 | Lu et al. |
| 2002/0115287 A1 | 8/2002 | Hashim et al. |
| 2003/0034244 A1 | 2/2003 | Yasar et al. |
| 2003/0116427 A1 | 6/2003 | Ding et al. |
| 2003/0129828 A1 | 7/2003 | Cohen |
| 2003/0216035 A1 | 11/2003 | Rengarajan et al. |
| 2004/0048461 A1 | 3/2004 | Chen |
| 2004/0094402 A1 | 5/2004 | Gopalraja et al. |
| 2004/0152301 A1 | 8/2004 | Hashim et al. |
| 2004/0171250 A1 | 9/2004 | Chiang et al. |
| 2004/0188239 A1 | 9/2004 | Robison et al. |
| 2004/0211661 A1 | 10/2004 | Zhang et al. |
| 2004/0224507 A1* | 11/2004 | Marieb et al. ............... 438/687 |
| 2004/0266175 A1 | 12/2004 | Chen et al. |
| 2005/0006222 A1 | 1/2005 | Ding et al. |
| 2005/0020080 A1 | 1/2005 | Chiang et al. |
| 2005/0032382 A1 | 2/2005 | Rossman |
| 2005/0085068 A1 | 4/2005 | Chiang et al. |
| 2005/0085070 A1 | 4/2005 | Park |
| 2005/0103620 A1 | 5/2005 | Chistyakov |
| 2005/0106865 A1 | 5/2005 | Chung et al. |
| 2005/0110147 A1* | 5/2005 | Wu et al. ............... 257/758 |
| 2005/0173239 A1 | 8/2005 | Somekh et al. |
| 2005/0186793 A1 | 8/2005 | Omoto et al. |
| 2005/0211545 A1 | 9/2005 | Cerio, Jr. et al. |
| 2005/0252765 A1 | 11/2005 | Zhang et al. |

| | | | |
|---|---|---|---|
| 2005/0255690 A1 | 11/2005 | Chen et al. | |
| 2005/0255691 A1 | 11/2005 | Ding et al. | |
| 2005/0255700 A1 | 11/2005 | Gopalraja et al. | |
| 2005/0266682 A1 | 12/2005 | Chen et al. | |
| 2005/0272254 A1 | 12/2005 | Ding et al. | |
| 2006/0014378 A1 | 1/2006 | Aggarwal et al. | |
| 2006/0024953 A1 | 2/2006 | Rao et al. | |
| 2006/0030151 A1 | 2/2006 | Ding et al. | |
| 2006/0057843 A1 | 3/2006 | Chen et al. | |
| 2006/0125100 A1 | 6/2006 | Arakawa | |
| 2006/0148253 A1 | 7/2006 | Chung et al. | |
| 2006/0207873 A1 | 9/2006 | Fu | |
| 2006/0258152 A1 | 11/2006 | Haider | |
| 2007/0020922 A1 | 1/2007 | Chiang et al. | |
| 2007/0178682 A1 | 8/2007 | Chiang et al. | |
| 2007/0193982 A1 | 8/2007 | Brown et al. | |
| 2007/0197012 A1 | 8/2007 | Yang et al. | |
| 2007/0283886 A1* | 12/2007 | Chung et al. | 118/719 |
| 2008/0142359 A1 | 6/2008 | Gopalraja et al. | |
| 2008/0190760 A1 | 8/2008 | Tang et al. | |
| 2008/0310005 A1 | 12/2008 | Tonar et al. | |
| 2009/0233438 A1 | 9/2009 | Ding et al. | |

FOREIGN PATENT DOCUMENTS

| | | |
|---|---|---|
| EP | 0 692 551 A1 | 1/1996 |
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.
Ashanti et al., "A New Hollow-Cathode Magnetron Source for 0.10. mu.m Copper Applications", Journal of Vacuum Science and Technology, A 18(4) Jul./Aug. 2000 p. 1546.
Cohen et al., "Reactive Preclean Technology for Nonphysical Copper Oxide Reduction for Advanced CU Interconnect", Jun. 16-Jun. 18, 1998, VMIC Conference, pp. 91 and 93.
Jian Li and J.W. Mayer and E. G. Colgan, "Oxidation and Protection in Copper and Copper Alloy Thin Films", J. Appl. Phys. 70 (5), Sep. 1, 1991, pp. 2820-2827.
Ding et al., "Observation of Reduced Oxidation Rates for Plasma-Assisted CVD Copper Films", Mat. Res. Soc. Symp. Proc., vol. 309, 1993 pp. 445-460.
Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.
M. Zinke-Allmang, "Phase Separation on Solid Surfaces: Nucleation, Coarsening and Coalescence Kinetics".
Peijun Ding, et al., "Copper Barrier, Seed Layer and Planarization Technologies," VMIC Conference, Jun. 10-12, 1997, pp. 87-92.
Tarek Suwwan de Felipe, et al., "Electrical Stability and Microstructural Evolution in Thin Films of High Conductivity Copper Alloys," IEEE, Jun. 1999, pp. 293-295.
Cho et al., "Factors Affecting Passivation and Resistivity of Cu(Mg) Alloy Film," Materials Research Society Symposium Proc. vol. 564, 1999, pp. 353-358.
Murarka et al., "Copper Metallization for ULSI and Beyond," Critical Reviews in Solid State and Materials Sciences, 1995, pp. 87-124.
Braeckelmann et al. "Integration and Reliability of Copper Magnesium Alloys for Multilevel Interconnects," IEEE, Feb. 2000, pp. 236-238.
Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.
Ding et al., "Effects of the addition of small amounts of Al to copper: Corrosion, resistivity, adhesion, morphology, and diffusion," J. Appl. Phys. 75(7), Apr. 1994, pp. 3627-3631.
T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.
Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.
Cho et al., "Remote Plasma-Assisted Metal Organic Chemical Vapor Deposition of Tantalum Nitride Thin Films with Different Radicals," Dec. 1998, Jpn. J. Appl. Phys., vol. 37.
Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.
Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.
Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.
Hayden et al., "Characterization of Magnetron-Sputtered Partially Ionized Aluminum Deposition," Mar./Apr. 1998, J. Vac. Sci. Technol., A 16(2), pp. 624-627.
Hayden et al., "Helion Plasma Source for Ionized Physical Vapor Deposition," 1999, Surface and Coatings Technology, 120-121 (1999), pp. 401-404.
Lee et al., "The Failure Mechanism of MOCVD TiN Diffusion Barrier at High Temperature," 1996, Mat. Res. Soc. Symp. Proc., vol. 324, pp. 279-284.
Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.
Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.
Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.
Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.
Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, J. Phys. Chem., 1995, 99, pp. 8831-8842.
Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.
Danek et al., "Barrier First Method for Single Damascene Trench Applications," Novellus Systems, Inc., U.S. Appl. No. 11/714,465, filed Mar. 5, 2007.
U.S. Office Action mailed Jul. 31, 2002, from U.S. Appl. No. 09/862,539.
U.S. Office Action mailed Sep. 16, 2002, from U.S. Appl. No. 09/776,704.
U.S. Office Action mailed Apr. 22, 2002, from U.S. Appl. No. 09/776,704.
U.S. Final Office Action mailed Apr. 3, 2003, from U.S. Appl. No. 09/816,847.
U.S. Office Action mailed Oct. 4, 2002, from U.S. Appl. No. 09/816,847.
U.S. Office Action mailed Oct. 23, 2002, from U.S. Appl. No. 09/965,472.
U.S. Office Action mailed Oct. 3, 2003, from U.S. Appl. No. 10/412,562.
U.S. Final Office Action mailed Mar. 23, 2006, from U.S. Appl. No. 10/804,353.
U.S. Office Action mailed Oct. 3, 2006, from U.S. Appl. No. 10/804,353.
U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during Cl$_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between a Diffusion Barrier Layer and A Seed Layer," Novellus Systems, Inc., U.S. Appl. No. 11/807,178, filed May 24, 2007.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S Appl. No. 11/558,693.

Allowed Claims from U.S Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

U.S. Office Action mailed on May 26, 2009 for U.S. Appl. No. 11/564,222.

U.S. Final Office Action mailed Jun. 17, 2009 for U.S. Appl. No. 11/701,984.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

U.S. Office Action for U.S. Appl. No. 12/154,984, mailed Oct. 6, 2009.

D'Couto et al. J. Vac. Sci. Technol. B. 2001, 19(1), pp. 244-249.

U.S. Final Office Action for U.S. Appl. No. 11/588,586 mailed Nov. 4, 2009.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 2, 2010 for U.S. Appl. No. 11/807,182.

U.S. Office Action mailed Mar. 5, 2010 for U.S. Appl. No. 11/807,178.

U.S. Notice of Allowance mailed Mar. 8, 2010 for U.S. Appl. No. 11/714,465.

U.S. Final Office Action mailed Apr. 15, 2010 for U.S. Appl. No. 12/154,984.

U.S. Office Action mailed May 12, 2010 for U.S. Appl. No. 11/807,183.

Danek et al., "Barrier First Method for Single Damascene Trench Applications," Novellus Systems, Inc., U.S. Appl. No. 12/764,870, filed Apr. 21, 2010.

Notice of Allowance mailed Mar. 24, 2010, for U.S. Appl. No. 11/588,586.

Allowed Claims for U.S. Appl. No. 11/588,586.

* cited by examiner

Downstream EM tester cross section

Upstream EM tester cross section

US 8,017,523 B1

DEPOSITION OF DOPED COPPER SEED LAYERS HAVING IMPROVED RELIABILITY

FIELD OF THE INVENTION

The present invention pertains to methods for forming a copper seed layer on a barrier layer of a partially fabricated integrated circuit.

BACKGROUND OF THE INVENTION

Damascene processing is a method for forming interconnections on integrated circuits that involves formation of inlaid metal lines in trenches and vias formed in a dielectric layer (inter-metal dielectric). The metal conductive lines are formed by an electroplating process. Because copper or other mobile conductive material provides the conductive paths of the integrated circuit, the underlying silicon devices must be protected from metal ions (e.g., $Cu^{2+}$) that might otherwise diffuse or drift into the silicon. Suitable materials for diffusion barrier include tantalum, tantalum nitride, tungsten, titanium, titanium tungsten, titanium nitride, tungsten nitride, and the like.

After the diffusion barrier is deposited and prior to electroplating, a seed layer of copper or other metal is typically applied by a physical vapor deposition (PVD) process to enable subsequent electrofilling of the features with copper inlay. In order to serve as a seed for electroplating, the seed layer should be continuous, stable and have good adhesion to the barrier layer. A barrier or capping layer may be deposited on the inlaid copper after it has been planarized via a chemical mechanical polishing process.

An integration issue when using Cu as the primary conductor in devices is electromigration. Electromigration redistributes the Cu in the line, and the resulting extrusions can expand into the dielectric space. Extrusions can cause the Cu metal to extend past the Cu line into an adjacent Cu line, thereby causing a short circuit.

As the dimension of semiconductor devices continues to shrink, the reliability of the device, particularly the electromigration of copper interconnects, becomes more challenging. This reduction of the electromigration performance is due to the increase of current density and decrease of the critical void dimension as the dimensions shrink.

SUMMARY OF THE INVENTION

The present invention provides improved methods of depositing copper seed layers in copper interconnect structure fabrication processes. The resulting structures have improved electromigration performance and reduced line resistance associated with the use of an alloy seed. According to various embodiments, the methods involve depositing a copper seed bilayer on a barrier layer in a recessed feature on a partially fabricated semiconductor substrate. The bilayer has a copper alloy seed layer and a pure copper seed layer, with the pure copper seed layer deposited on the copper alloy seed layer. The copper seed bilayers have reduced line resistance increase and provide better electromigration performance than conventional doped copper seed layers. Precise line resistance control can be achieved by tuning the bilayer thickness to meet the desired electromigration performance.

These and other features and advantages of the present invention will be described in more detail below with reference to the associated drawings.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term "wafer" will be used interchangeably with "partially fabricated integrated circuit." One skilled in the art would understand that the term "partially fabricated integrated circuit" can refer to a silicon wafer during any of many stages of integrated circuit fabrication thereon. The term "substrate" is also used and includes wafers.

Figure 1A:
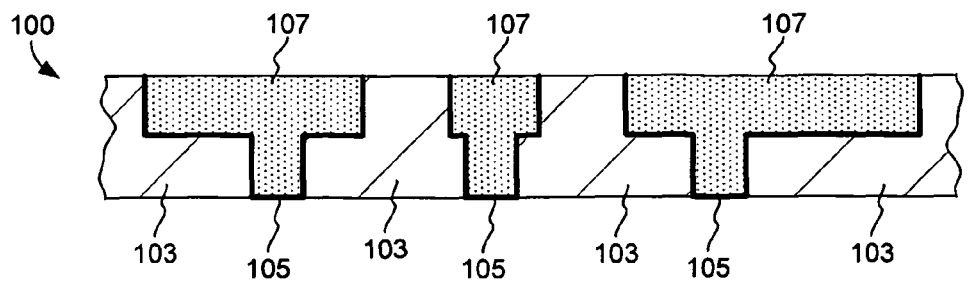
FIGS. 1A-1I show cross sectional depictions of device structures created during a dual Damascene fabrication process.

The invention finds particular use in damascene processing. FIGS. 1A-1H show cross sectional depictions of device structures created at various stages of a dual damascene fabrication process, with the cross sectional depiction of a completed structure created by the dual damascene process is shown in FIG. 1I. Referring to FIG. 1A, an example of a typical substrate, 100, used for dual damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper provides the conductive paths of the integrated circuit, the underlying silicon devices must be protected from metal ions (e.g., $Cu^{2+}$) that might otherwise diffuse or drift into the silicon.

Suitable materials for diffusion barrier 105 include tantalum, tantalum nitride, tungsten, titanium, titanium tungsten, titanium nitride, tungsten nitride, and the like. In a typical process, barrier 105 is formed by a physical vapor deposition (PVD) process such as sputtering, a chemical vapor deposition (CVD) process, or an atomic layer deposition (ALD) process. In the embodiments described herein copper serves as the metal in damascene processes, as depicted in these figures. The resultant partially fabricated integrated circuit 100 is a representative substrate for subsequent damascene processing, as depicted in FIGS. 1B-1H.

Figure 1B:
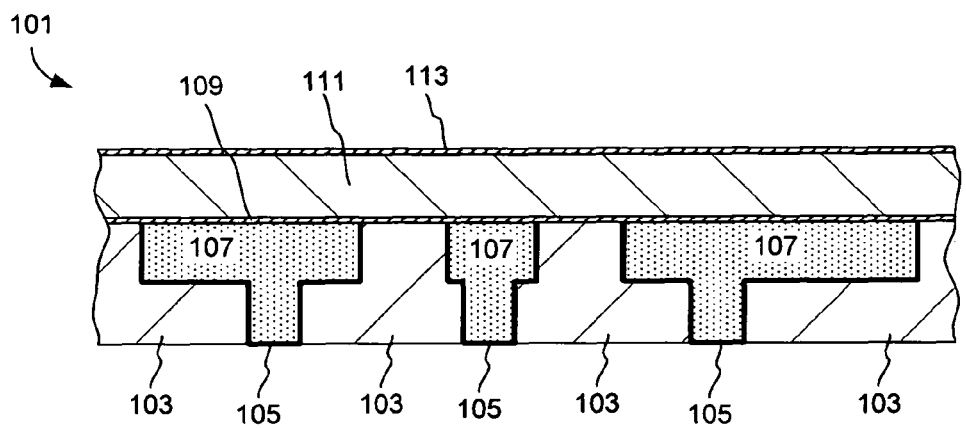

As depicted in FIG. 1B, a silicon nitride or silicon carbide diffusion barrier 109 is deposited to encapsulate conductive routes 107. Next, a first dielectric layer, 111, of a dual damascene dielectric structure is deposited on diffusion barrier 109. This is followed by deposition of an etch-stop layer 113 (e.g., composed of silicon nitride or silicon carbide) on the first dielectric layer 111.

Figure 1C:
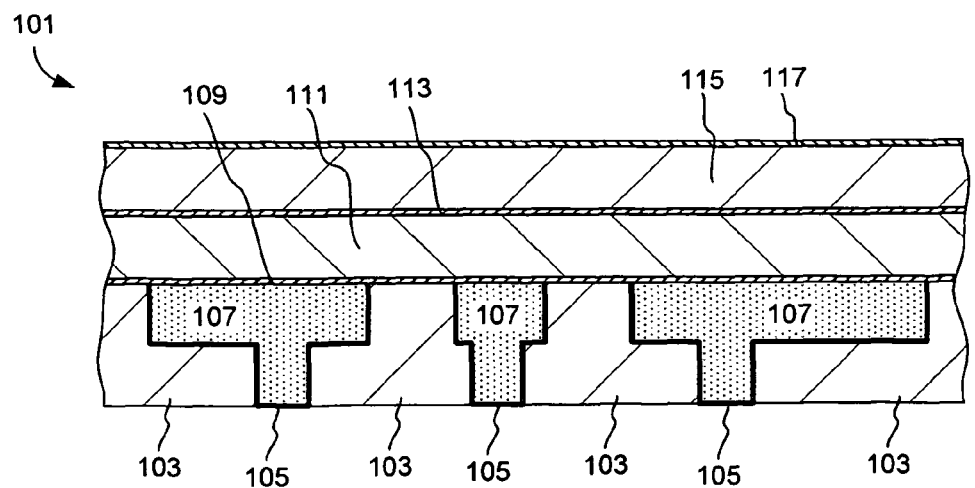

The process follows, as depicted in FIG. 1C, where a second dielectric layer 115 of the dual damascene dielectric structure is deposited in a similar manner to the first dielectric layer 111, onto etch-stop layer 113. Deposition of an antireflective layer 117, typically a silicon oxynitride, follows.

Figure 1D:
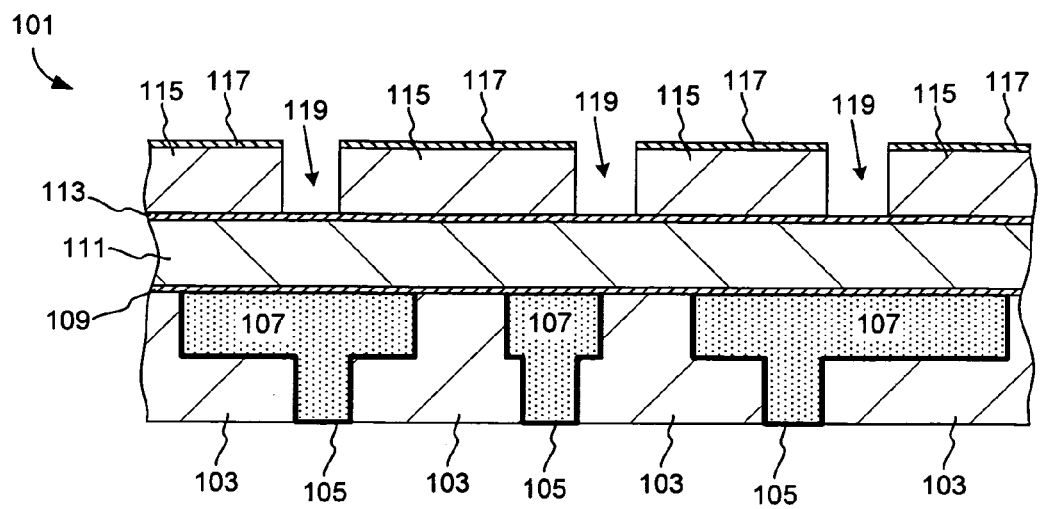
Figure 1E:
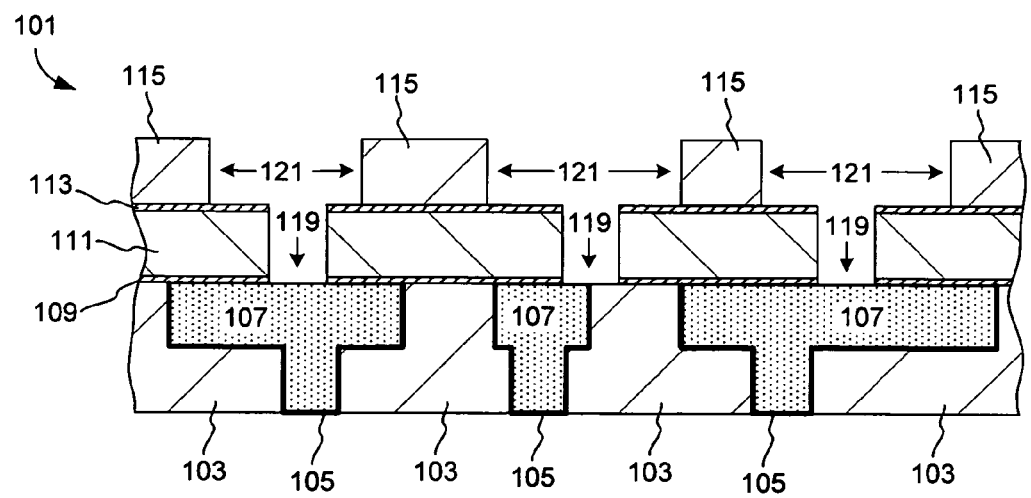

The dual damascene process continues, as depicted in FIGS. 1D-1E, with etching of vias and trenches in the first and second dielectric layers. First, vias 119 are etched through antireflective layer 117 and the second dielectric layer 115. Standard lithography/etch techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
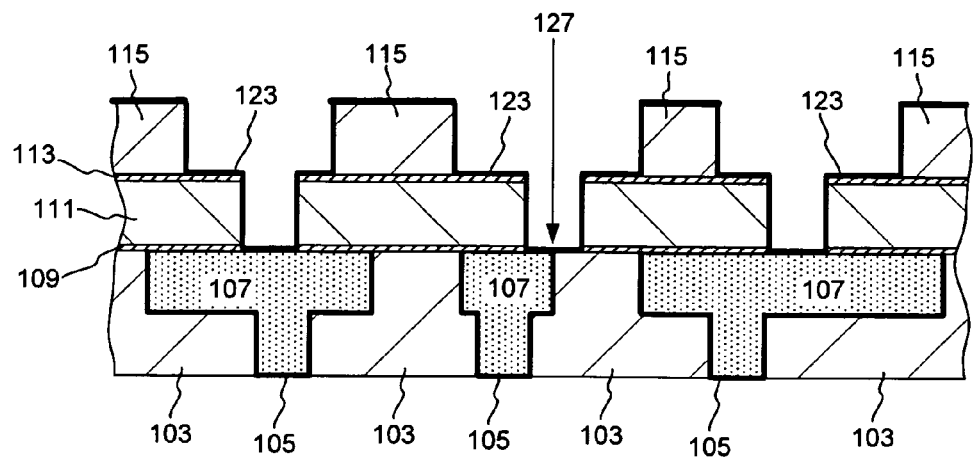

Next, as depicted in FIG. 1F, these newly formed vias and trenches are, as described above, coated with a diffusion barrier 123. As mentioned above, barrier 123 is made of tantalum, or other materials that effectively block diffusion of copper atoms into the dielectric layers.

Figure 1G:
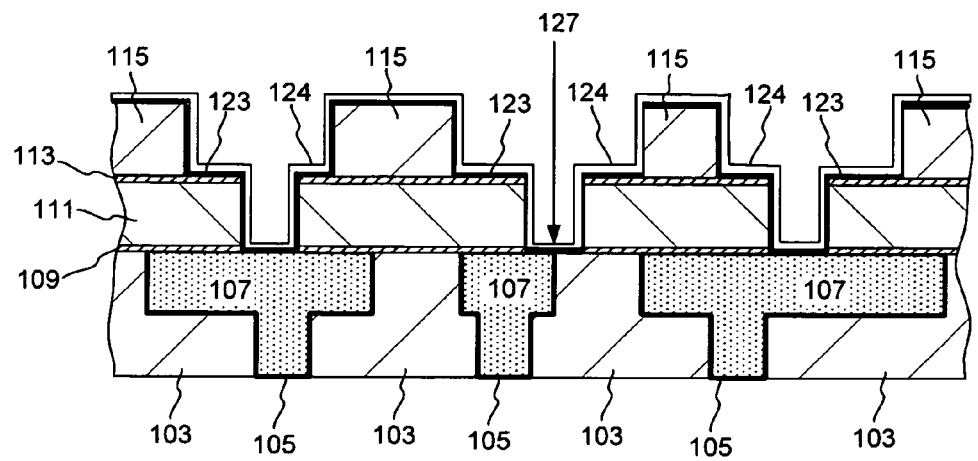
Figure 1H:
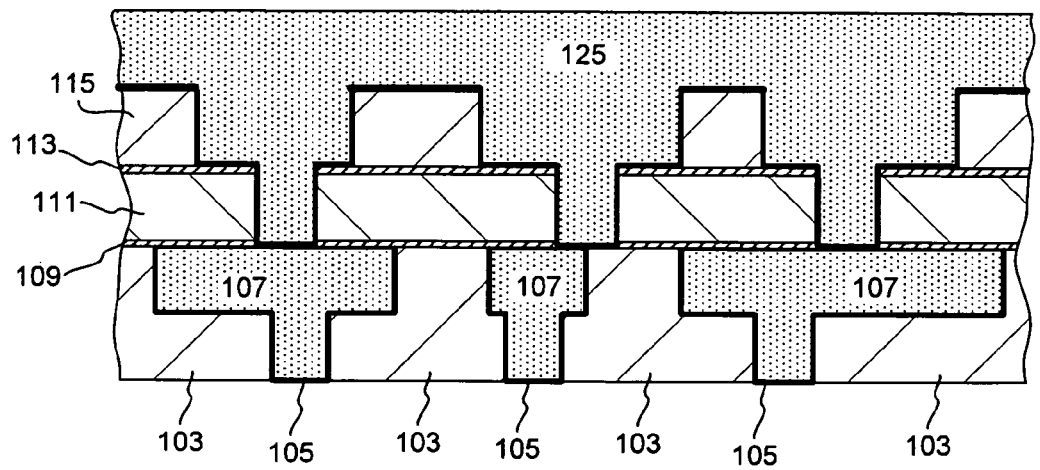
Figure 1I:
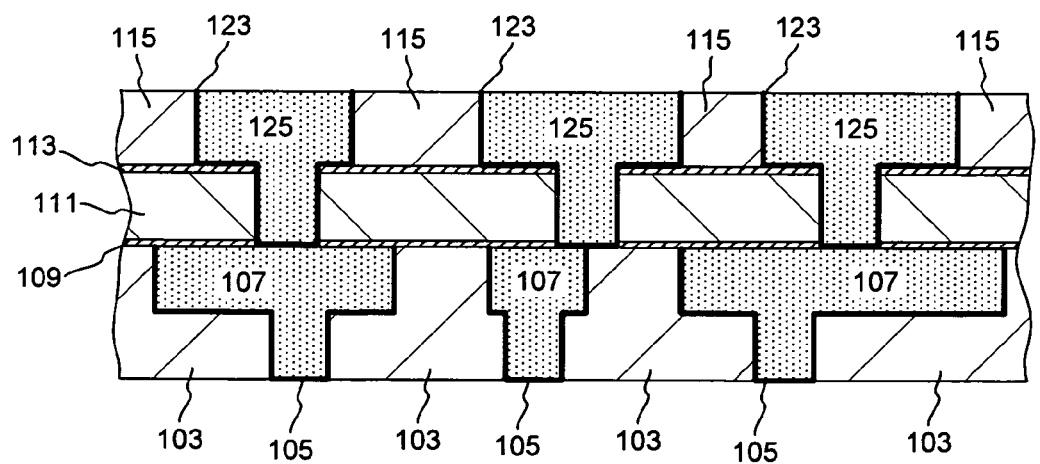

After diffusion barrier 123 is deposited, a seed layer 124 is deposited as shown in FIG. 1G. The copper seed layer typically conforms to the diffusion barrier 123 and enables subsequent electrofilling of the features with copper inlay. As is discussed further below, in certain embodiments described herein the copper seed layer is a copper alloy seed/pure copper seed bilayer. Inlaid copper 125 after electrofilling is shown on FIG. 1H. The blanket layer of electrodeposited copper is removed by chemical mechanical polishing (CMP) leaving the conductive material only inside the features. FIG. 1I shows the completed dual damascene process, in which copper conductive routes 125 are inlayed (seed layer not depicted) into the via and trench surfaces over barrier 123.

Copper routes 125 and 107 are now in electrical contact and form conductive pathways, as they are separated only by diffusion barrier 123, which is also somewhat conductive. A diffusion barrier or capping layer such as silicon carbide may then be deposited over the copper routes.

As indicated above, the present invention relates to deposition of seed layers on diffusion barriers. Although FIGS. 1A-1I illustrate a dual damascene process, one of skill in the art will recognize that the methods of the present invention may be used with other process flows, including single damascene processes.

Figure 2:
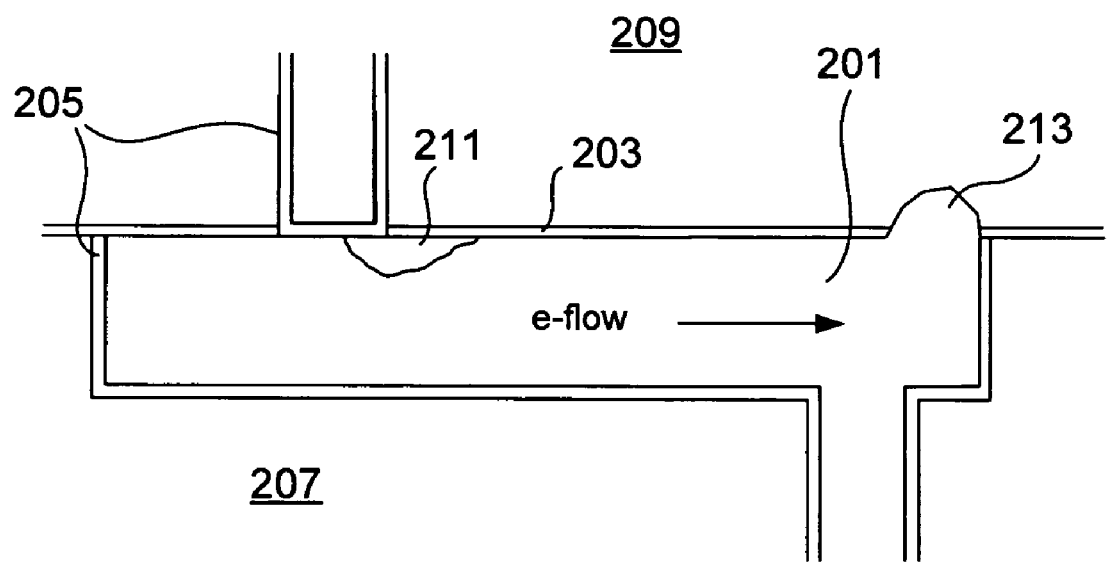
FIG. 2 is a schematic illustration of part of a damascene structure in a semiconductor device showing a void in a copper line caused by electromigration.

The above description refers to copper as the conductive material. Copper is typically used in place of other materials such as aluminum because of its higher conductivity. One issue that is present with copper conductive lines is electromigration. Electromigration is the transport of material in a conductor caused by the gradual movement of ions due to the momentum transfer between conducting electrons and diffusing metal atoms. In an integrated circuit having copper conductive paths, electromigration redistributes the copper, and the resulting extrusions can expand into the dielectric space. In general, electromigration occurs when the metal atoms of conductive lines are subjected to electric fields while the circuit is in operation. The metal atoms will redistribute in the direction of the electron flow to form voids (areas lacking metal material) and extrusions (protrusions of metal material outside of the metal or dielectric barrier). For example, this is illustrated along a metal line in damascene device of FIG. 2, which illustrates a cross section of a part of a damascene device in which a Cu line 201 is encapsulated by metal diffusion barriers 205, typically made of tantalum, tantalum nitride or combination thereof, between the Cu and surrounding dielectric material 207. In addition, a dielectric capping layer 203 is deposited between the Cu line 201 and dielectric 209 to avoid electrical shorting of adjacent metal lines and to complete the Cu encapsulation. A void 211 has formed at a capping layer/Cu interface, causing the Cu buildup and formation of an extrusion 213 downstream of the electron flow in the Cu line 201. Voids will cause the Cu line to thin and eventually separate completely, causing an open circuit. Extrusions can cause the Cu metal to extend past the Cu line into an adjacent Cu line, thereby causing a short circuit.

As the dimension of semiconductor devices continues to shrink, electromigration performance is reduced and electromigration becomes more of a problem. This reduction in electromigration performance is due to the increase of current density and decrease of the critical void dimension required to short the interconnect or other conductive path. Alloy doping, such as aluminum doping is used in conventional devices to improve the electromigration performance. Prior to the methods described herein, however, electromigration improvement has come at the cost of high line resistance increase when alloy doping is used. High line resistance in turn leads to higher RC delay and decreasing device performance. The methods described herein reduce Cu interconnect line resistance increase when alloy doping is used for reliability improvement.

Figure 3:
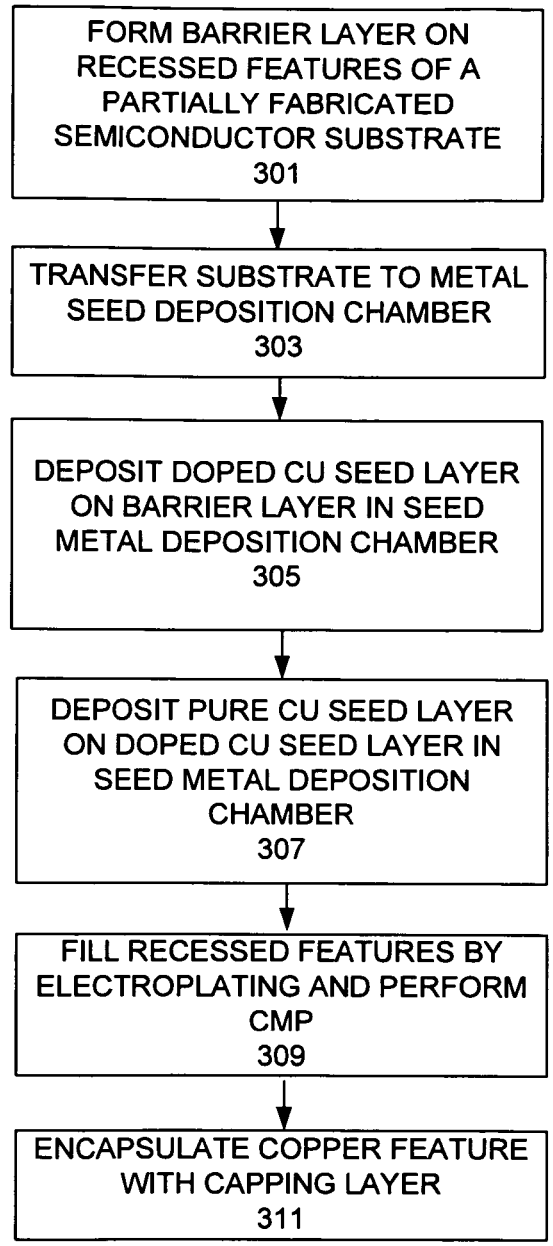
FIG. 3 is a process flow diagram illustrating relevant operations employed to form conductive lines by damascene processing according to various embodiments of the present invention.

FIG. 3 is a process flow diagram depicting operations in forming a copper feature according to certain embodiments of the invention. The process starts with the deposition of barrier sublayer (block 301). This deposition process may be accomplished by a PVD or iPVD technique but other deposition methods may be also used, including chemical vapor deposition (CVD), plasma enhanced chemical vapor deposition (PECVD), atomic layer deposition (ALD), electroless deposition, selective reduction of an organometallic precursor from a supercritical solution, and the like. PVD processes may be preferred in some applications to deposit high quality, low-resistance films. Suitable barrier layer materials include, but are not limited to, tantalum, tantalum nitride, tungsten, titanium tungsten, titanium nitride, tungsten nitride, cobalt, ruthenium and combinations of these.

In certain embodiments, a Ta/TaN bilayer is used as the barrier layer. The barrier layer is generally deposited to conform to the recessed feature. Forming the conformal barrier layer may involve resputtering and/or additional deposition operations to achieve generally conformal and uniform coverage. In certain embodiments, all or some of the portion of the barrier layer at the feature bottom may be removed, e.g., by resputtering all of the barrier layer material at the bottom of the feature or by a punch-through resputter etch into the underlying copper lines. Other steps may be added to the general process flow as necessary.

In an operation 303, the substrate is then transferred to a metal seed deposition module or chamber. The metal seed deposition module is a vacuum chamber that is capable of depositing a metal seed layer. In some embodiments, a suitable PVD apparatus employs a magnetic array for electron confinement to generate a high density plasma. The magnetic array may be implemented as one or more electromagnets, permanent magnets, or some combination of electromagnets and permanent magnets. The apparatus may include other magnets located proximate the substrate region for promoting process uniformity.

Examples of suitable apparatuses include hollow cathode magnetron (HCM) sputtering modules. Such apparatuses are described in further below as well as in U.S. Pat. Nos. 5,482,611; 6,179,973; 6,193,854; and 6,217,716, each of which is incorporated herein by reference for all purposes. Other types of sputtering apparatuses that may be used in accordance with the invention include planar magnetron sputtering modules. Also, as described below, the apparatus typically employs a RF biased electrostatic chuck pedestal, which secures the wafer and applies an RF bias on the wafer, if needed.

In the metal seed deposition chamber, a doped copper seed layer is deposited on the barrier layer to conform to the feature. In certain embodiments, the doped copper seed layer may contact the underlying metal at the bottom of the feature if the barrier layer is not present there. Deposition of the doped layer typically occurs using a target having the desired alloy concentration. Examples of Cu dopants include Al, Mg, Zr, Ti, Sn, Pd and Cr. If necessary, e.g., to increase uniformity or thickness, depositing the doped copper seed layer may involve resputtering and/or additional deposition steps.

Next, a pure copper seed layer is deposited on the doped copper seed layer, forming a copper seed bilayer. See block 307. In this context, pure copper refers to substantially pure copper, i.e., without a significant dopant concentration. According to various embodiments, the pure layer may have less than 0.5% dopant concentration, less than 0.25% dopant concentration, less than 0.1% dopant concentration, less than 0.05% dopant concentration, and/or substantially no dopant concentration. In certain embodiments, operations 305 and 307 are performed without exposure to ambient or other oxidant. In many embodiments, this involves transferring the substrate to a second metal deposition chamber or module without a vacuum break, i.e., using a vacuum transfer module. In other embodiments, deposition of both layers of the bilayer seed layer are carried out in the same chamber, e.g., using a segmented target as described in U.S. patent application Ser. No. 11/564,222, filed Jun. 22, 2006, and titled "Method and Apparatus for Controlling Sputtered Flux in PVD Sources," which is hereby incorporated by reference herein for all purposes.

After the copper alloy seed bilayer is deposited, the feature is filled with copper using an electrofilling process and the feature is planarized with a CMP process. Block 309. The feature is then encapsulated by depositing a dielectric diffusion barrier such as silicon carbide or other material on the feature.

Figure 4:
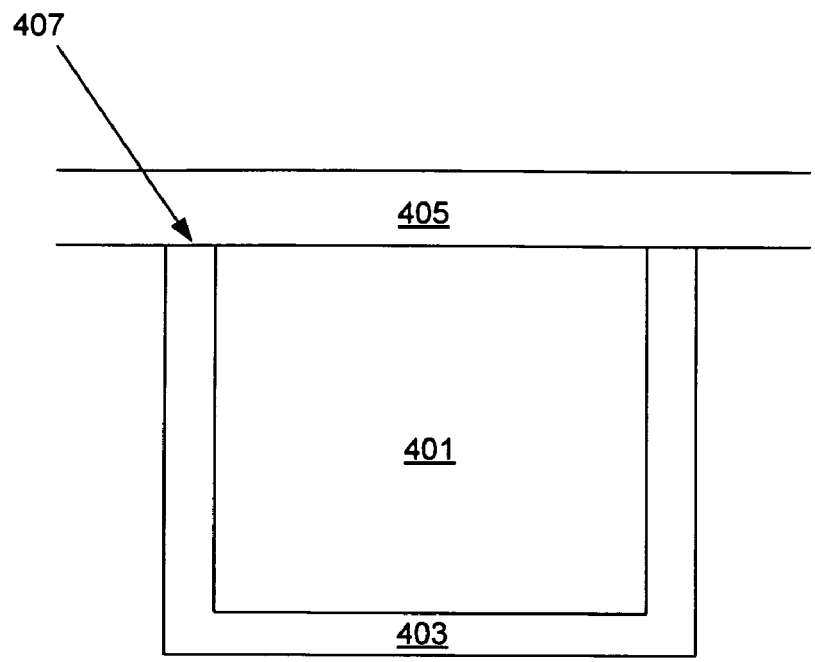
FIG. 4 is a cross sectional depiction of device structure having a barrier layer overlaying a copper feature in a dielectric material in accordance with embodiments of the invention.

Using the bilayer Cu seed layer provides improved reliability over conventional Al-doped Cu seed monolayers, as well as providing improved line resistance over these conventional processes. The bilayer also provides improved electromigration performance and conformal deposition of the seed layer over conventional copper only seed layers. Use of doped-Cu/pure Cu bilayer was found to unexpectedly result in enhanced electromigration performance over conventional doped Cu monolayers, even when the total amount of dopant remained the same or was reduced. Based on these unexpected results (detailed below) and without being bound by a particular theory, it is believed that the pure copper seed layer of the bilayer protects the aluminum or other dopant in the doped copper layer from oxidizing, which in turn allows diffusion of the dopant to reinforce the copper/overlying diffusion interface thereby improving electromigration. FIG. 4 shows an example of a copper feature 401 and seed layer 403 in a dielectric material. Barrier layer 405, e.g., SiC or SiN, overlays the feature 401 as well as the surrounding dielectric. The interface shown at 407 is the most susceptible to electromigration. Protecting the dopant from oxidation in turn allows the aluminum (or other dopant) to diffuse to and reinforce the interface shown at 407. It also may prevent any intrinsic defects that may be caused by the presence of alumina. In addition to improving electromigration performance, the aluminum doped seed layer has improved wettability on the diffusion barrier surface over pure copper.

Figure 5:
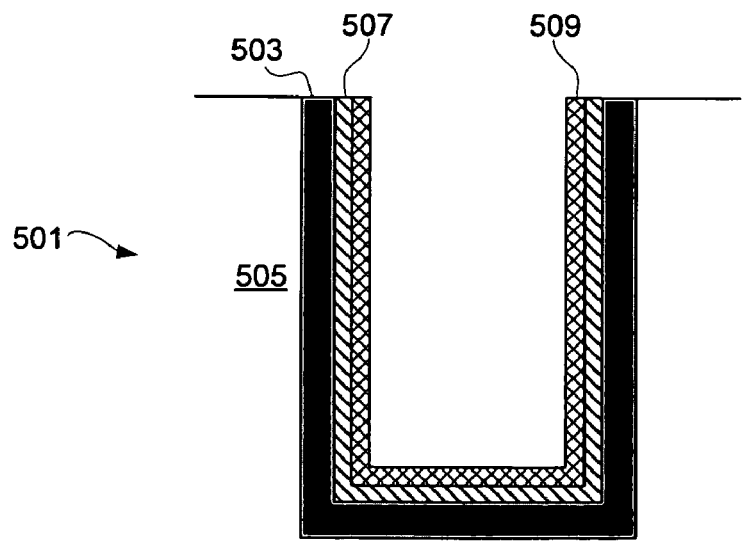
FIG. 5 is a cross sectional depiction of device structure after deposition of a copper seed bilayer in accordance with embodiments of the invention.

FIG. 5 depicts a schematic representation of a cross-section of a feature after deposition of the copper seed bilayer. Feature 501 in dielectric material 505 is shown with diffusion barrier layer 503 deposited in the feature. Conformal doped copper seed layer 507 and pure copper seed layer 509 are also shown. Appropriate dopants include Al, Mg, Zr, Ti, Sn, Pd and Cr, with aluminum being used in particular embodiments. The amount of aluminum or other dopant should be sufficient improve electromigration, but low enough to avoid high increases in line resistance. According to various embodiments, the doped copper seed layer is between about 0.05-5% (atomic) doped, more particularly between about 0.1%-2.5%, and even more particularly between about 0.25-1% doped. The doped copper seed layer contains a substantially higher percentage of doping than the pure copper seed layer.

Total field thickness of the bilayer depends on the technology node, ranging from about 300 Å (e.g., for 32 nm) to over 800 (e.g., for 65 nm). For the 45 nm node, for example, the total thickness of the bilayer typically ranges from 300-600 Å; for the 32 nm node, the total thickness may be between about 300-350 Å, or lower.

The pure copper layer of the bilayer should be thick enough to prevent oxidation of the underlying alloy layer. According to various embodiments, the thickness of the pure copper layer ranges from about 25 Å to a few hundred angstroms. The thickness of the alloy layer should be sufficient to provide electromigration improvement. According to various embodiments, the thickness of the alloy layer ranges from about 25 Å to a few hundred angstroms.

Electromigration performance and line resistance increases with increasing amounts of dopant in the bilayer. For equivalent or improved electromigration performance, the Al/Cu+Cu seed bilayers have less resistance shift than conventional doped monolayers.

In certain embodiments, the ratio of the alloy layer thickness to pure copper layer thickness is greater than 1:1, i.e., the alloy layer is thicker than the pure copper layer. Bilayers having such ratios results in electromigration improvement over a alloy monolayer having more dopant while providing reducing line resistance shift.

In other embodiments, the ratio may be about 1:1 or less than 1:1. As is described further below with respect to FIGS. 8 and 9, precise line resistance control can be achieved via the bilayer thickness tuning in order to meet the desired electromigration performance. The amount of dopant in the bilayer depends on dopant concentration in the alloy as well as alloy layer thickness; in certain embodiments, it may be desirable to tune this parameter as well to achieve the desired performance as well as minimizing overall thickness.

Apparatus

As indicated above, any suitable deposition apparatus appropriate for performing the metal seed deposition operations may be used, including PVD apparatuses that use hollow cathode magnetron (HCM) or planar magnetron targets.

Figure 6:
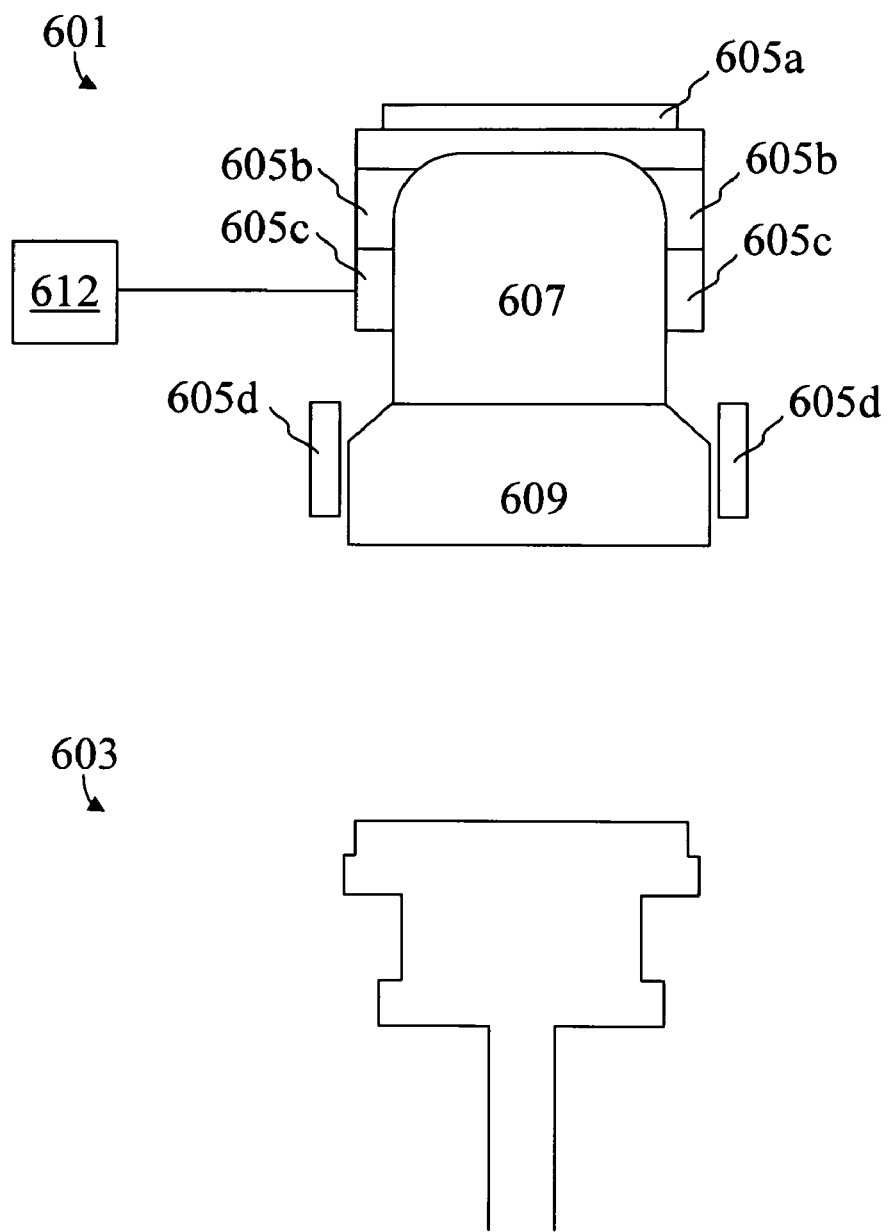
FIG. 6 is a cross-sectional depiction of a hollow cathode magnetron (HCM) apparatus suitable for practicing the current invention.

FIG. 6 presents a simple cross sectional view of one type of HCM sputtering apparatus that can be used in accordance with the invention. The HCM apparatus has two main components, the source 601, in which plasma is created and maintained, and the RF bias electrostatic chuck (ESC) pedestal 603, which secures the wafer and applies an RF bias on the wafer, if needed. In this specific example, the source 601 contains four electromagnets 605a-605d, a cathode target 607 and an anode 609. The cathode target 607 generally has a hollow cup-like shape so that plasma formed in the source can be concentrated within this hollow region. The cathode target 607 also serves as a sputter target and is, therefore, made of the metal material, such as copper or copper alloy, which is to be deposited onto the substrate.

An inert gas, such as argon, is introduced to into the hollow region of the cathode target 607 to form plasma. An intense magnetic field is produced by electromagnets 605a-605d within the cathode target region. Additional electromagnets are arranged downstream of the cathode target so that different currents can be applied to each electromagnet, thereby producing an ion flux and a controlled deposition and/or etch rate and uniformity. A metal spacer 609, typically held at plasma floating potential, is used, in conjunction with the source electromagnets to shape the plasma distribution at the target mouth. The RF bias ESC pedestal 603 holds the wafer substrate in place and can apply a RF bias to the wafer substrate. The ion energy, and therefore the deposition and/or etch rate can also be controlled by the pedestal RF bias. Typically, the amount of sputtering is controlled by the RF power at fixed RF frequency. Various RF frequencies can be used to achieve this effect. One preferred RF frequency is 13.56 MHz. An additional function of the ESC pedestal is to provide wafer temperature control during sputter etch and deposition. Typically, argon backside gas is used to provide thermal coupling between the substrate and the ESC. In many cases, the ESC is cooled during deposition.

As indicated above, the metal seed deposition, as well as other process steps in the overall process flow may be in done in the same processing tool. Tools that allow degas, ALD or CVD deposition, and PVD deposition all under the same vacuum are the INOVA and INOVA NExT deposition systems available from Novellus Systems of San Jose, Calif. These systems are comprised of processing modules, e.g. for degas, cool, preclean, PVD, CVD or ALD processes, mounted to the same wafer handling module. Once a wafer is in the tool and a vacuum is established, all of the above described process aspects are performed. In particular embodiments, the barrier layer deposition occurs in a tantalum (or other barrier material) PVD deposition module, with the wafer then transferred to a first metal seed PVD deposition module for copper alloy seed layer deposition, and then to a second metal seed PVD deposition module for pure copper seed layer deposition.

Although the discussion herein focuses on deposition of seed layers by PVD processes, the scope of the invention extends to other techniques for deposition of the bilayers including ALD, iALD, CVD and combinations thereof. One of skill in the art will understand that the improvements in electromigration and line resistance shift may also be obtained with these methods and would understand how to implement them.

Returning to FIG. 6, in certain embodiments, a system controller 612 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all or some of the activities of the deposition apparatus. The system controller executes system control software including sets of instructions for controlling the timing, DC power levels, mixture of gases, chamber pressure, chamber temperature, wafer temperature, RF power levels, wafer chuck or susceptor position, and other parameters of a particular process. Other computer programs stored on memory devices associated with the controller may be employed in some embodiments.

Typically there will be a user interface associated with controller 612. The user interface may include a display screen, graphical software displays of the apparatus and/or process conditions, and user input devices such as pointing devices, keyboards, touch screens, microphones, etc.

The computer program code for controlling the deposition, resputtering and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, desired thickness of each layer of a bilayer, deposition time, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A bilayer thickness program may include program code for controlling the thickness of each layer of the bilayer by modulating deposition time, RF power levels, etc. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions Experimental Upstream and downstream electromigration test structures were fabricated using the copper seed deposition conditions shown in the below table to deposit seed layers prior to copper electroplating of the lines (trenches) and vias of the structures:

| Process Split ID No. and description | Cu seed layer deposition thickness and composition | PVD Process Detail | |
|---|---|---|---|
| | | Al/Cu layer | Pure Cu layer |
| 1 - pure Cu seed | 450 Å pure Cu | NA | Dep 350 Å/Etch 75 Å/Dep 100 Å |
| 2 - doped Cu monolayer seed | 450 Å 1% Al/Cu | Dep 350Å/Etch 75Å/Dep 100 Å | NA |
| 3 - doped Cu monolayer seed | 450 Å 0.5% Al/Cu | Dep 350Å/Etch 75Å/Dep 100 Å | NA |
| 4 - bilayer seed | 335 Å 1% Al/Cu + 115 Å Cu | Dep 335 Å | Etch 75 Å/Dep 115 Å |
| 5 - bilayer seed | 225 Å 1% Al/Cu + 225 Å Cu | Dep 225 Å | Dep 125 Å/Etch 75 Å/Dep 100 Å |
| 6 - bilayer seed | 115 Å1% Al/Cu + 335 Å Cu | Dep 115 Å | Dep 235 Å/Etch 75Å/Dep 100Å |
| 7 - reverse bilayer seed | 225 Å Cu + 225 Å 1% Al/Cu | Dep 125Å/Etch 75Å/Dep 100 Å (second) | Dep 225 Å(first) |

Figure 7:
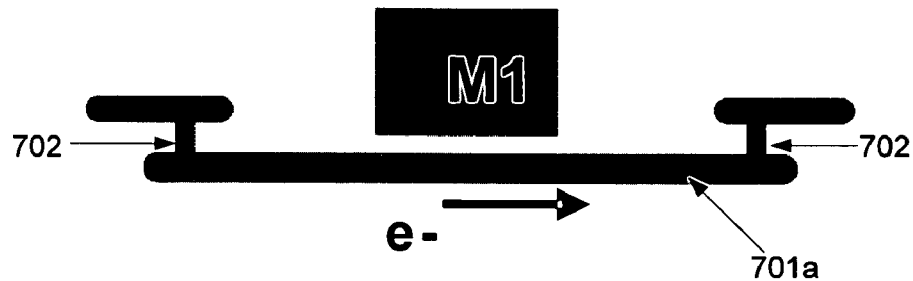
FIG. 7 are cross-sectional depictions of upstream and downstream electromigration test structures used to measure electromigration performance of devices made in accordance with embodiments of the invention.
Figure 7:
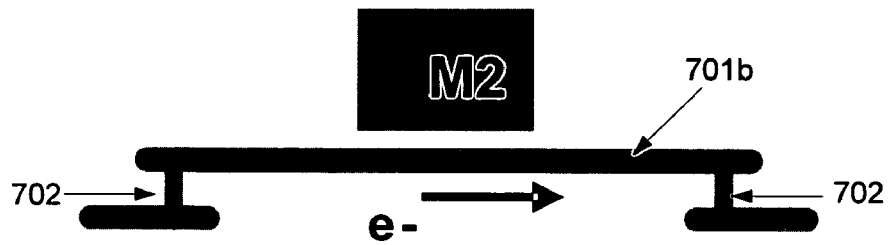

FIG. 7 shows cross-sections of the downstream and upstream test structures. As indicated, electron flow (e−) is along lines 701a and 701b. Vias 702 are indicated. The copper seed layers were deposited on Ta/TaN diffusion barriers. After the electroplating process, SiC layers were deposited to encapsulate the copper line.

Downstream Electromigration Improvement

The following test structure dimensions (cross-section depicted in FIG. 7) and test conditions were used to test the downstream electromigration:

M1 line dimensions (L×W×H): 500 μm×90 nm×180 nm
Via: 90 nm diameter. Single link.
Temperature: 325° C.
Current density (J): 2.5 MAmperes/cm$^2$, with stress current adjusted based on the physical SEM cross section of the mean trench dimension, where the actual stress current applied on individual test key is calculated based on the measured resistance of individual test key. 16 test keys are generally used for each test.

The following results were obtained:

| Process Split ID No. and description | mean TTF (h) | Sigma Sigma |
|---|---|---|
| 1 - baseline (pure copper) | 13.2 | 0.6 |
| 2 - 450 Å Al$_{.01}$/Cu | 239 | 0.6 |
| 3 - 450 Å Al$_{.005}$/Cu | 84.3 | 0.9 |
| 4 - 335 Å Al$_{.01}$/Cu + 115 Å Cu | 738 | 1 |
| 5 - 225 Å Al$_{.01}$/Cu + 225 Å Cu | 258.7 | 0.6 |
| 6 - 115 Å Al$_{.01}$/Cu + 335 Å Cu | 77.5 | 0.6 |
| 7 - 225 Å Cu + 225 Å Al$_{.01}$/Cu | 129 | 0.7 |

The Al/Cu—Cu bilayer resulted the highest mean time to failure: the 335 Å Al0.01/Cu+115 Å Cu seed bilayer (process ID 4) resulted in mean TTF of 738, an improvement over both of the conventional Al-doped copper seed monolayers, which had mean TTFs of 239 (process ID 2) and 84.3 (process ID 3), respectively. It should be noted that for the Al-doped monolayers, the layer having the highest concentration of aluminum results in the best electromigration performance, as would be expected. Similarly, increasing the amount of aluminum in the bilayers increases electromigration performance. Unexpectedly, the 335 Å Al$_{0.01}$/Cu+115 Å Cu seed bilayer and 225 Å Al$_{0.01}$/Cu+225 Å Cu seed bilayer outperform the 450 Å Al$_{0.01}$/Cu monolayer despite having less aluminum in the seed layer. It should also be noted that the 225 Å Al$_{0.01}$/Cu+225 Å Cu performs significantly better than the reverse bilayer, despite having the same total amount of aluminum.

Upstream Electromigration Improvement

The following test structure dimensions (cross-section depicted in FIG. 7) and test conditions were used to test the downstream electromigration:

M2 line dimensions (L×W×H): 500 μm×90 nm×180 nm
Via: 90 nm diameter. Single link.
Temperature: 325° C.
Current density (J): 2.5 MAmperes/cm$^2$, current adjusted

| Process Split ID No. and description | Mean TTF (hr) | Sigma |
|---|---|---|
| 1 - baseline (pure copper) | 9.3 | 0.7 |
| 2 - 450 Å Al$_{.01}$/Cu | 6.2 | 0.4 |
| 3 - 450 Å Al$_{.005}$/Cu | 7.9 | 0.2 |
| 4 - 335 Å Al$_{.01}$/Cu + 115 Å Cu | 81.9 | 0.38 |
| 5 - 225 Å Al /Cu + 225 Å Cu | 41.6 | 0.5 |
| 6 - 115 Å Al /Cu + 335 Å Cu | 9.7 | 0.3 |
| 7 - 225 Å Cu + 225 Å Al$_{.01}$/Cu | 8.6 | 0.7 |

The test structure used for the upstream electromigration test has narrow metal 2 line width and thus high aspect ratio for the trench over via structure. Hence during the metal barrier/seed process (PVD) and electro plating, the requirements for PVD step coverage and formation of continuous layer are more stringent due to the resulted high aspect ratio structure. The Al-doped Cu/pure Cu bilayers show significant improvement over the Al-doped Cu monolayers. Note that while both the 335 Å Al$_{0.01}$/Cu+115 Å Cu and 225 Å Al$_{0.01}$/Cu+225 Å Cu bilayers (process IDs 4 and 5, respectively) have significantly higher mean time to failure than the Al-doped Cu monolayers and the baseline pure copper monolayer, the 115 Å Al$_{0.01}$/Cu+335 Å Cu (process ID 6) does not. This indicates that the amount of dopant in the bilayer is not high enough to provide electromigration improvement. Furthermore, split 7 which has pure Cu as the first layer followed by 1% Al/Cu does not provide EM improvement as split 5, suggesting the order of depositing alloy Cu seed and pure Cu seed can impact the electromigration improvement.

Resistance

Figure 8:
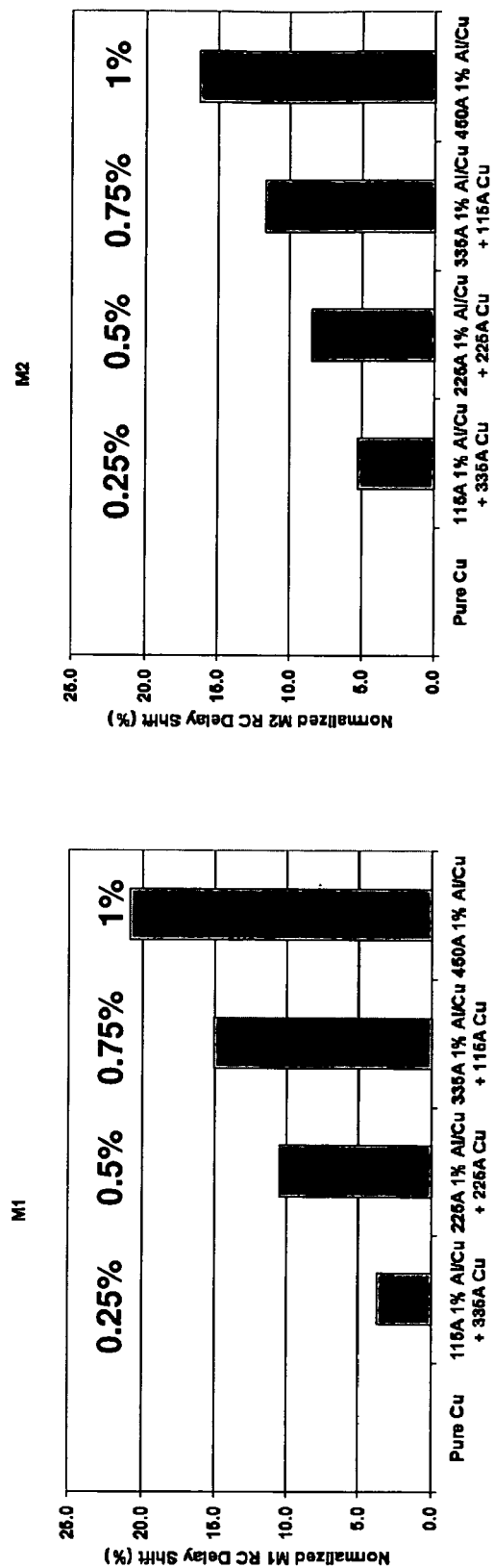
FIG. 8 shows plots depicting the normalized RC delay for metallization lines M1 and M2 of devices made in accordance with embodiments of the invention as compared to devices made using seed monolayers.

Line and via resistance were measured for each of the Al/Cu splits. No Kelvin via resistance difference was observed between splits. FIG. 8 shows the normalized line RC delay shift for lines M1 and M2, with percentages indicating the amount of aluminum normalized to 450 Å 1% Al. The RC delay shift correlates to line resistance shift. The results demonstrate that precise resistance shift control can be achieved by modulating the Al (or other dopant) doping.

Figure 9:
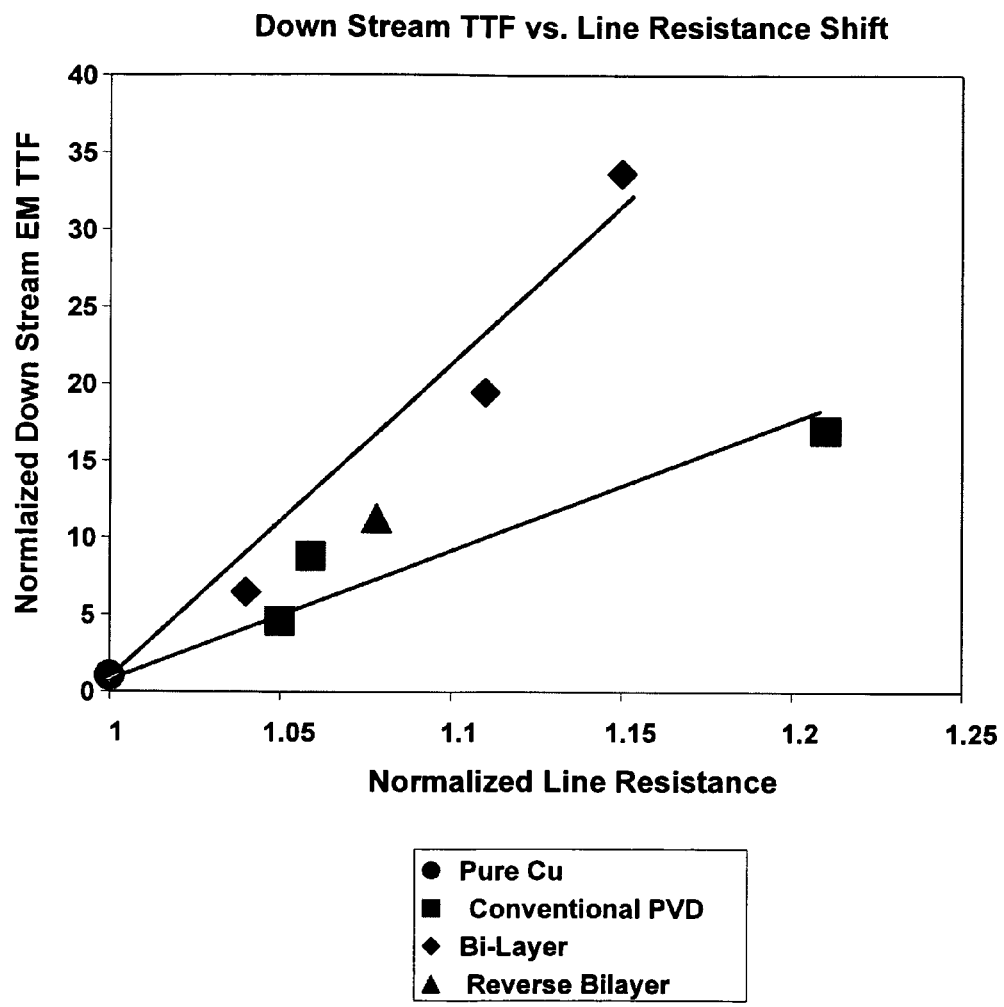
FIG. 9 is a plots depicting the normalized downstream electromigration performance plotted against the normalized resistance shift for devices made in accordance with embodiments of the invention as compared to devices made using seed monolayers.

FIG. 9 is a plot of normalized downstream EM improvement (as indicated by normalized TTF) plotted against normalized resistance shift. Resistance is normalized to pure Cu as 1, down stream EM is normalized to the control split pure Cu seed as 1. Rough trendlines estimated for the Al/Cu+Cu bilayer data points as well as for the conventional Al/Cu monolayers are shown. It is desirable for the slope of this line to be as high as possible, i.e., for a high electromigration improvement over pure Cu seed to be obtained with a low resistance shift. The figure shows that the Al/Cu+Cu bilayer results in less resistance shift for the same (or better EM performance). The bilayer Al/Cu+Cu seed, for example, shows ~11% line resistance increase, but provides better down stream electromigration than single layer Al/Cu seed, which leads to ~21% higher line resistance shift. Precise line resistance control can be achieved by tuning the bilayer thickness to meet the desired electromigration performance.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a copper interconnect structure on a partially fabricated integrated circuit substrate, the method comprising:
providing a recessed feature in a dielectric layer, said feature having a barrier layer on at least the sidewalls of the feature; and
forming a copper seed bilayer on at least a portion of the barrier layer, wherein forming said copper seed bilayer comprises depositing by a vapor deposition process a copper alloy seed layer on at least a portion of the barrier layer and depositing a pure copper seed layer by a vapor deposition process on the copper alloy seed layer, wherein the ratio of copper alloy seed layer thickness to pure copper seed layer thickness is greater than or equal to about 1:1 and wherein the thickness of the copper alloy seed layer is at least about 25 Å.

2. The method of claim 1 wherein the barrier layer comprises one or more of the following: Ta, $TaN_x$, Ti, $TiN_x$, W, $WN_x$, Ru, and Co.

3. The method of claim 1 wherein the copper alloy seed layer comprises aluminum.

4. The method of claim 1 further comprising filling the feature with bulk conductive material comprising copper.

5. The method of claim 4 further comprising depositing a dielectric barrier silicon carbide layer on the filled feature.

6. The method of claim 1 wherein the total thickness of the bilayer is no more than about 1000 Å.

7. The method of claim 1 wherein the total thickness of the bilayer is no more than about 450 Å.

8. The method of claim 1 wherein the copper seed alloy layer comprises about 0.25-2 atomic % aluminum.

9. The method of claim 1 wherein the recessed feature is a via.

10. The method of claim 1 wherein the recessed feature is a trench.

11. The method of claim 1 wherein providing a recessed feature comprises providing a dual damascene feature.

12. The method of claim 1 wherein depositing a copper alloy seed layer on at least a portion of the barrier layer comprises sputtering copper alloy from a copper alloy target.

13. The method of claim 1 wherein depositing a pure copper seed layer on at least a portion of the barrier layer comprises sputtering copper from a copper target.

14. The method of claim 1 wherein forming a copper seed bilayer comprises depositing the pure copper seed layer on the copper alloy seed layer without exposure of the copper alloy seed layer to oxidizing conditions.

15. The method of claim 14 wherein forming a copper seed bilayer comprises transferring the partially fabricated integrated circuit substrate from a copper alloy seed layer deposition chamber to a pure copper seed deposition chamber under vacuum conditions.

16. The method of claim 1 wherein the total thickness of the copper seed bilayer is between about 300 Å and 800 Å such that the thickness of the copper alloy seed layer is at least about 150 Å.

* * * * *